(12) United States Patent
Lin et al.

(10) Patent No.: US 12,424,296 B2
(45) Date of Patent: Sep. 23, 2025

(54) CIRCUIT FOR TESTING MEMORIES

(71) Applicant: REALTEK SEMICONDUCTOR CORPORATION, Hsinchu (TW)

(72) Inventors: Sheng-Lin Lin, Hsinchu (TW); Shih-Chieh Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 10 days.

(21) Appl. No.: 18/236,751

(22) Filed: Aug. 22, 2023

(65) Prior Publication Data

US 2024/0145020 A1    May 2, 2024

(30) Foreign Application Priority Data

Nov. 1, 2022   (TW) ................... 111141682

(51) Int. Cl.
*G11C 29/12*    (2006.01)
(52) U.S. Cl.
CPC .................... *G11C 29/12* (2013.01)
(58) Field of Classification Search
CPC ....................................... G11C 29/12
See application file for complete search history.

(56) References Cited

U.S. PATENT DOCUMENTS

| | | | |
|---|---|---|---|
| 5,173,906 A | 12/1992 | Dreibelbis | |
| 5,436,910 A * | 7/1995 | Takeshima | G11C 29/34 |
| | | | 365/201 |
| 5,457,696 A * | 10/1995 | Mori | G11C 29/34 |
| | | | 365/201 |
| 5,537,632 A * | 7/1996 | Gorshe | G11C 29/10 |
| | | | 714/42 |
| 5,553,082 A | 9/1996 | Connor | |
| 6,092,227 A * | 7/2000 | Toki | G11C 29/34 |
| | | | 714/736 |

(Continued)

FOREIGN PATENT DOCUMENTS

TW    I550399 B    9/2016

OTHER PUBLICATIONS

E. S. Sogomonyan, A. Morosov, M. Gossel, A. Singh and J. Rzeha, "Early error detection in systems-on-chip for fault-tolerance and at-speed debugging," Proceedings 19th IEEE VLSI Test Symposium. VTS 2001, Marina Del Rey, CA, USA, 2001, pp. 184-189. (Year: 2001).*

(Continued)

*Primary Examiner* — Albert Decady
*Assistant Examiner* — Enamul M Kabir
(74) *Attorney, Agent, or Firm* — WPAT, PC (57) ABSTRACT

A circuit for testing a memory is provided. An input end of the memory is coupled to a register, and the circuit for testing the memory transmits data to the memory through the register. The circuit for testing the memory performs the following operations sequentially: writing a first data into a target address of the memory, all bits of the target address being at the same level, and all bits of the first data being at the same level; writing a second data to the target address of the memory, all bits of the second data being at the same level, and the second data being different from the first data; reading from the target address an output data; and determining whether the output data is correct.

18 Claims, 13 Drawing Sheets

(56) References Cited

U.S. PATENT DOCUMENTS

| | | | | |
|---|---|---|---|---|
| 6,345,372 B1* | 2/2002 | Dieckmann | G11C 29/10 | 714/719 |
| 7,577,885 B2* | 8/2009 | Hasegawa | G11C 29/54 | 714/719 |
| 9,310,436 B2 | 4/2016 | Picalausa | | |
| 11,404,134 B2 | 8/2022 | Lin | | |
| 2004/0190331 A1 | 9/2004 | Ross | | |
| 2005/0216799 A1* | 9/2005 | Azimane | G11C 29/02 | 714/718 |
| 2007/0280014 A1* | 12/2007 | Sekiguchi | G11C 29/02 | 365/200 |
| 2008/0141075 A1* | 6/2008 | Kliewer | G11C 29/1201 | 714/E11.002 |
| 2014/0119147 A1 | 5/2014 | Stephani | | |
| 2016/0111170 A1 | 4/2016 | Zhao | | |
| 2016/0180966 A1* | 6/2016 | Lee | G11C 29/40 | 714/719 |
| 2016/0231797 A1 | 8/2016 | Meir | | |
| 2016/0365157 A1 | 12/2016 | Sang | | |
| 2021/0210155 A1* | 7/2021 | Eckel | G11C 29/38 | |
| 2021/0383885 A1 | 12/2021 | Chien | | |
| 2022/0180956 A1* | 6/2022 | Lin | G11C 29/1201 | |

OTHER PUBLICATIONS

Kishinevsky, Kondratyev, Lavagno, Saldanha and Taubin, "Partial scan delay fault testing of asynchronous circuits," 1997 Proceedings of IEEE International Conference on Computer Aided Design (ICCAD), San Jose, CA, USA, 1997, pp. 728-735. (Year: 1997).*
V. R. Devanathan and S. Vooka, "Techniques to improve memory interface test quality for complex SoCs" 2011, in Proc. International Test, IEEE.

* cited by examiner

| period | T1 | T2 | T3 | T4 | T5 |
|---|---|---|---|---|---|
| operation | write | write | read and compare | read and compare | result capture |
| WE | 1 | 1 | 0 | 0 | X |
| ADDR [m-1:0] | 10...10 | 01...01 | 10...10 | 01...01 | XX...XX |
| DI [n-1:0] | 10...10 | 01...01 | XX...XX | XX...XX | XX...XX |
| DO [n-1:0] | XX...XX | XX...XX | DO1 | DO2 | XX...XX |

FIG. 3

| period | T1 | T2 | T3 | T4 | T5 |
|---|---|---|---|---|---|
| operation | write | write | read and compare | read and compare | result capture |
| WE | 1 | 1 | 0 | 0 | X |
| ADDR [m-1:0] | 01...01 | 10...10 | 01...01 | 10...10 | XX...XX |
| DI [n-1:0] | 01...01 | 10...10 | XX...XX | XX...XX | XX...XX |
| DO [n-1:0] | XX...XX | XX...XX | DO1 | DO2 | XX...XX |

FIG. 4

| period | T1 | T2 | T3 | T4 | T5 |
|---|---|---|---|---|---|
| operation | write | write | read and compare | read and compare | result capture |
| WE | 1 | 1 | 0 | 0 | X |
| ADDR [m-1:0] | 11...11 | 00...00 | 11...11 | 00...00 | XX...XX |
| DI [n-1:0] | 11...11 | 00...00 | XX...XX | XX...XX | XX...XX |
| DO [n-1:0] | XX...XX | XX...XX | DO1 | DO2 | XX...XX |

FIG. 5

| period | T1 | T2 | T3 | T4 | T5 |
|---|---|---|---|---|---|
| operation | write | write | read and compare | read and compare | result capture |
| WE | 1 | 1 | 0 | 0 | X |
| ADDR [m-1:0] | 00..00 | 11..11 | 00..00 | 11..11 | XX..XX |
| DI [n-1:0] | 00..00 | 11..11 | XX..XX | XX..XX | XX..XX |
| DO [n-1:0] | XX..XX | XX..XX | DO1 | DO2 | XX..XX |

FIG. 6

| period | T1 | T2 | T3 | T4 | T5 | T6 | T7 | T8 | T9 |
|---|---|---|---|---|---|---|---|---|---|
| operation | write | write | read and compare | read and compare | write | write | read and compare | read and compare | result capture |
| WE | 1 | 1 | 0 | 0 | 1 | 1 | 0 | 0 | X |
| ADDR [m-1:0] | 11..11 | 00..00 | 11..11 | 00..00 | 00..00 | 11..11 | 00..00 | 11..11 | XX..XX |
| DI [n-1:0] | 11..11 | 00..00 | XX..XX | XX..XX | 00..00 | 11..11 | XX..XX | XX..XX | XX..XX |
| DO [n-1:0] | XX..XX | XX..XX | DO1 | DO2 | XX..XX | XX..XX | DO3 | DO4 | XX..XX |

FIG. 7

| period | T1 | T2 | T3 | T4 | T5 | T6 | T7 | T8 | T9 |
|---|---|---|---|---|---|---|---|---|---|
| operation | write | write | read and compare | read and compare | write | write | read and compare | read and compare | result capture |
| WE | 1 | 1 | 0 | 0 | 1 | 1 | 0 | 0 | X |
| ADDR [m-1:0] | 00..00 | 11..11 | 00..00 | 11..11 | 11..11 | 00..00 | 11..11 | 00..00 | XX..XX |
| DI [n-1:0] | 00..00 | 11..11 | XX..XX | XX..XX | 11..11 | 00..00 | XX..XX | XX..XX | XX..XX |
| DO [n-1:0] | XX..XX | XX..XX | DO1 | DO2 | XX..XX | XX..XX | DO3 | DO4 | XX..XX |

FIG. 8

| period | T1 | T2 | T3 | T4 |
|---|---|---|---|---|
| operation | write | write | read and compare | result capture |
| WE | 1 | 1 | 0 | X |
| ADDR [m-1:0] | 00...00 | 00...00 | 00...00 | XX...XX |
| DI [n-1:0] | 11...11 | 00...00 | XX...XX | XX...XX |
| DO [n-1:0] | XX...XX | XX...XX | DO1 | XX...XX |

FIG. 9

| period | T1 | T2 | T3 | T4 |
|---|---|---|---|---|
| operation | write | write | read and compare | result capture |
| WE | 1 | 1 | 0 | X |
| ADDR [m-1:0] | 00..00 | 00..00 | 00..00 | XX..XX |
| DI [n-1:0] | 00..00 | 11..11 | XX..XX | XX..XX |
| DO [n-1:0] | XX..XX | XX..XX | DO1 | XX..XX |

FIG. 10

| period | T1 | T2 | T3 | T4 | T5 | T6 | T7 |
|---|---|---|---|---|---|---|---|
| operation | write | write | read and compare | write | write | read and compare | result capture |
| WE | 1 | 1 | 0 | 1 | 1 | 0 | X |
| ADDR [m-1:0] | 00...00 | 00...00 | 00...00 | 00...00 | 00...00 | 00...00 | XX...XX |
| DI [n-1:0] | 11..11 | 00..00 | XX..XX | 00..00 | 11..11 | XX..XX | XX...XX |
| DO [n-1:0] | XX..XX | XX..XX | DO1 | XX..XX | XX..XX | DO2 | XX...XX |

FIG. 11

| period | T1 | T2 | T3 | T4 | T5 | T6 | T7 |
|---|---|---|---|---|---|---|---|
| operation | write | write | read and compare | write | write | read and compare | result capture |
| WE | 1 | 1 | 0 | 1 | 1 | 0 | X |
| ADDR [m-1:0] | 00...00 | 00...00 | 00...00 | 00...00 | 00...00 | 00...00 | XX...XX |
| DI [n-1:0] | 00...00 | 11..11 | XX...XX | 11..11 | 00...00 | XX...XX | XX...XX |
| DO [n-1:0] | XX..XX | XX...XX | DO1 | XX...XX | XX...XX | DO2 | XX...XX |

CIRCUIT FOR TESTING MEMORIES

BACKGROUND OF THE INVENTION

1. Field of the Invention

The present invention generally relates to memories, and, more particularly, to memory test and related test circuits.

2. Description of Related Art

A chip with a specific function (e.g., a system on a chip (SoC)) usually includes logic circuits, functional registers, and a memory. The functional registers are registers used by the chip in general operations (e.g., when performing the specific function). Before a chip is delivered, the tests on the chip generally include scan tests and memory built-in self-tests (MBISTs). However, neither of the two tests can test faults on paths between the functional registers and the memory, such as the bridging fault (BF), the transition delay fault (TDF), the bridge slow-to-fall (BSF) fault, the bridge slow-to-rise (BSR) fault, etc. In order to test the above faults, the traditional method is to use a random-access memory (RAM) sequential automatic test pattern generation (ATPG) tool to generate test vectors, and then use the test vectors to perform multiple-period read and write operations on the memory through a scan chain. However, when there are a large number of logic circuits in the scan chain, the computational complexity of generating multiple periods of test vectors by the ATPG tool increases, making it more difficult for the ATPG tool to control the memory, which in turn leads to the problems of long test vector generation time, large number of test vectors, and low test coverage.

SUMMARY OF THE INVENTION

In view of the issues of the prior art, an object of the present invention is to provide a memory test circuit, so as to make an improvement to the prior art.

According to one aspect of the present invention, a test circuit for testing a memory is provided. An input end of the memory is coupled to a register, and the test circuit transmits data to the memory through the register. The test circuit performs the following operations sequentially: writing a first data into a first address of the memory; writing a second data into a second address of the memory; reading a first output data from the first address; reading a second output data from the second address; and determining whether the first output data and the second output data are correct. Any two adjacent bits of the first address are at different levels. Any two adjacent bits of the first data are at different levels. Any two adjacent bits of the second address are at different levels. Any two adjacent bits of the second data are at different levels.

According to another aspect of the present invention, a test circuit for testing a memory is provided. An input end of the memory is coupled to a register, and the test circuit transmits data to the memory through the register. The test circuit performs the following operations sequentially: writing a first data into a first address of the memory; writing a second data into a second address of the memory; reading a first output data from the first address; reading a second output data from the second address; and determining whether the first output data and the second output data are correct. All bits of the first address are at a first level. All bits of the first data are at the first level. All bits of the second address are at a second level that is different from the first level. All bits of the second data are at the second level.

According to still another aspect of the present invention, a test circuit for testing a memory is provided. An input end of the memory is coupled to a register, and the test circuit transmits data to the memory through the register. The test circuit performs the following operations sequentially: writing a first data into a target address of the memory; writing a second data into the target address of the memory; reading an output data from the target address; and determining whether the output data is correct. All bits of the target address are at the same level. All bits of the first data are at the same level. All bits of the second data are at the same level. The second data is different from the first data.

The technical means embodied in the embodiments of the present invention can solve at least one of the problems of the prior art. Therefore, compared to the prior art, the present invention can reduce the complexity of test vectors and solve the problems of long test vector generation time, large number of test vectors, and low test coverage in the prior art.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a test circuit for testing a memory. On account of that some or all elements of the test circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
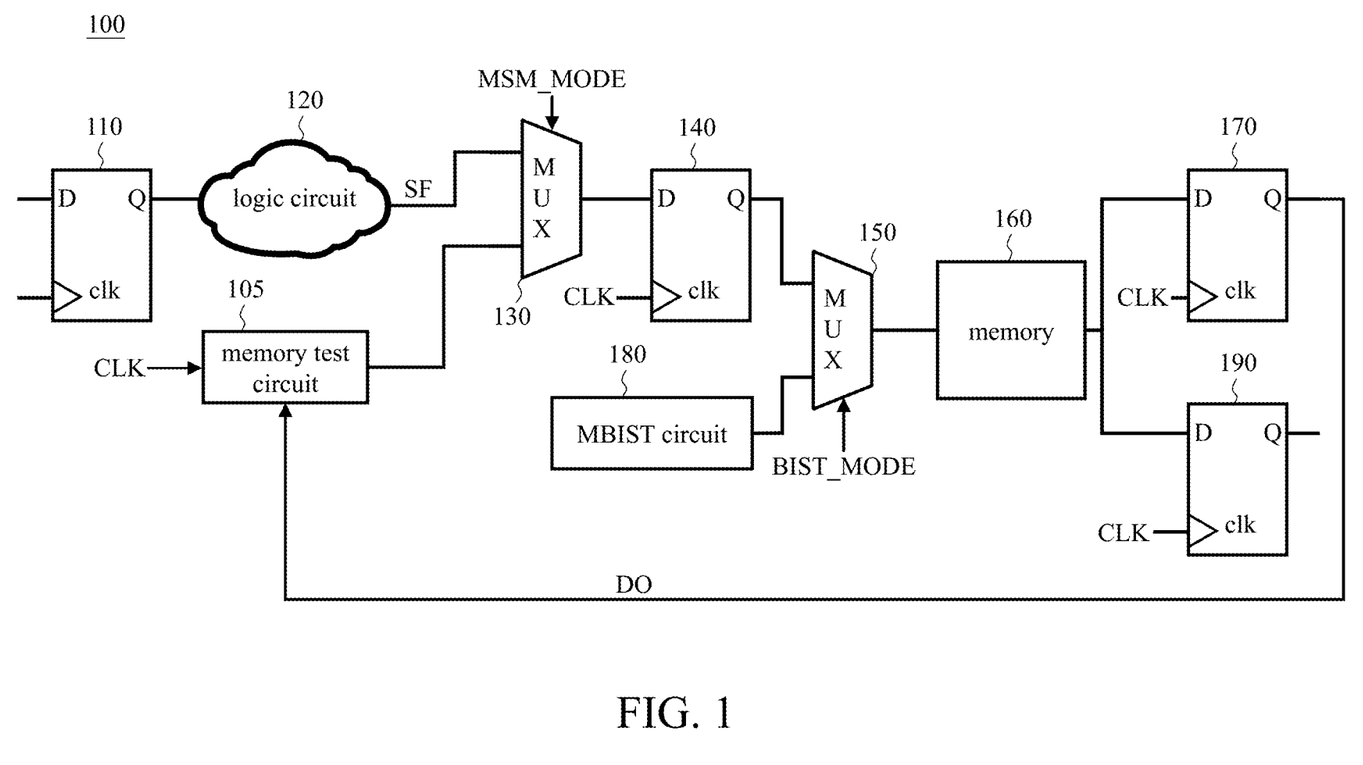
FIG. 1 shows the internal circuitry of a chip.

FIG. 1 shows internal circuitry of a chip. The chip 100 includes a register 110, a logic circuit 120, a multiplexer (MUX) 130, a register 140, a MUX 150, a memory 160, a register 170, an MBIST circuit 180, a register 190, and a memory test circuit 105. The register 110, the register 140, and the register 170 are functional registers, and the register 190 is an MBIST register. The memory test circuit 105 is coupled to the memory 160 through the MUX 130, the register 140, and the MUX 150. An input end of the register 110 and an output end of the register 170 can be coupled to other logic circuits or functional registers (not shown) in the chip. In this disclosure, the registers can be embodied by, but not limited to, scan D flip-flops.

In an MBIST mode, an internal or external control circuit (not shown) of the chip 100 uses a mode control signal BIST_MODE to control the MUX 150 to select an output of the MBIST circuit 180 and obtain an output of the memory 160 through the register 190.

In a normal operation mode, the MUX 150 is controlled by the mode control signal BIST_MODE to select the register 140 instead of the MBIST circuit 180, and the MUX 130 is controlled by a mode control signal MSM_MODE to select a function signal SF outputted by the logic circuit 120 instead of test signals outputted by the memory test circuit 105 (including a write enable signal WE, a memory address ADDR, and a test data DI (which is also referred to as a test vector), which will be discussed in detail below). The memory test circuit 105 does not receive the function signal SF, that is, the function signal SF does not pass through the memory test circuit 105.

In the test mode of the memory test circuit 105, the MUX 130 is controlled by the mode control signal MSM_MODE to select the test signals outputted by the memory test circuit 105, and the MUX 150 is controlled by the mode control signal BIST_MODE to select an output of the register 140.

Because the register 140 exists between the memory test circuit 105 and the memory 160, the memory test circuit 105 can test bridging faults (Embodiment 1), slow-to-rise TDFs/slow-to-fall TDFs (Embodiment 2), and bridge slow-to-fall faults/bridge slow-to-rise faults (Embodiment 3) (Embodiments 1-3 will be discussed in detail below). Note that because there is no register between the memory 160 and the conventional MBIST circuit 180, the conventional MBIST circuit 180 cannot test the above faults.

Figure 2:
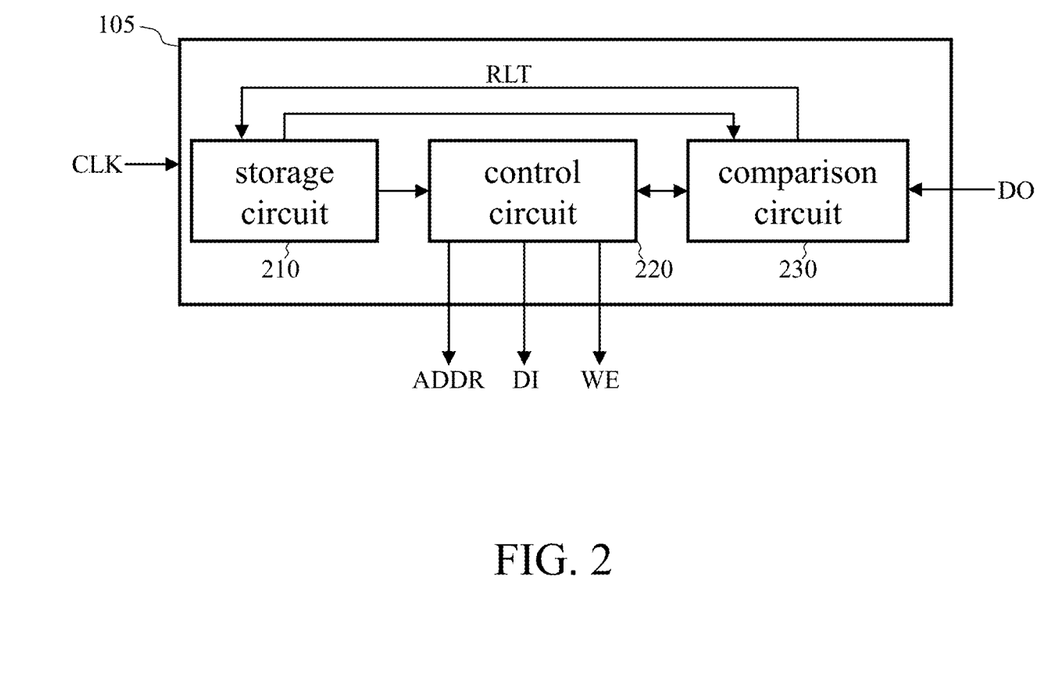
FIG. 2 shows a functional block diagram of a memory test circuit according to an embodiment of the present invention.

FIG. 2 shows a functional block diagram of a memory test circuit according to an embodiment of the present invention. The memory test circuit 105 includes a storage circuit 210, a control circuit 220, and a comparison circuit 230. In the test mode, the control circuit 220 controls or operates the memory 160 with the memory address ADDR, the write enable signal WE, and the test data DI. When the write enable signal WE is at a first level (e.g., high level or logic 1), data can be written into the memory 160. When the write enable signal WE is at a second level (e.g., low level or logic 0), data cannot be written into the memory 160. The test data DI is the data to be written into the memory 160, and the memory address ADDR is a target address of a write operation or a read operation.

When performing the test, the control circuit 220 reads the test data DI from the storage circuit 210 and writes the test data DI into the memory address ADDR of the memory 160. An output data DO is the data read from the memory 160. The comparison circuit 230 compares the output data DO with the test data to generate a test result RLT, which indicates whether the output data DO is correct (i.e., whether the memory 160 passes the test). For example, when the output data DO is identical to the test data (i.e., the output data DO is correct), the memory 160 passes the test.

In the following discussion, the memory address ADDR contains m bits, and each of the test data DI and the output data DO contains n bits, where m and n are both positive integers greater than or equal to two, and m can be equal to or different from n. "X" stands for "don't care."

Embodiment 1 (the Bridging Fault Test)

Figure 3:
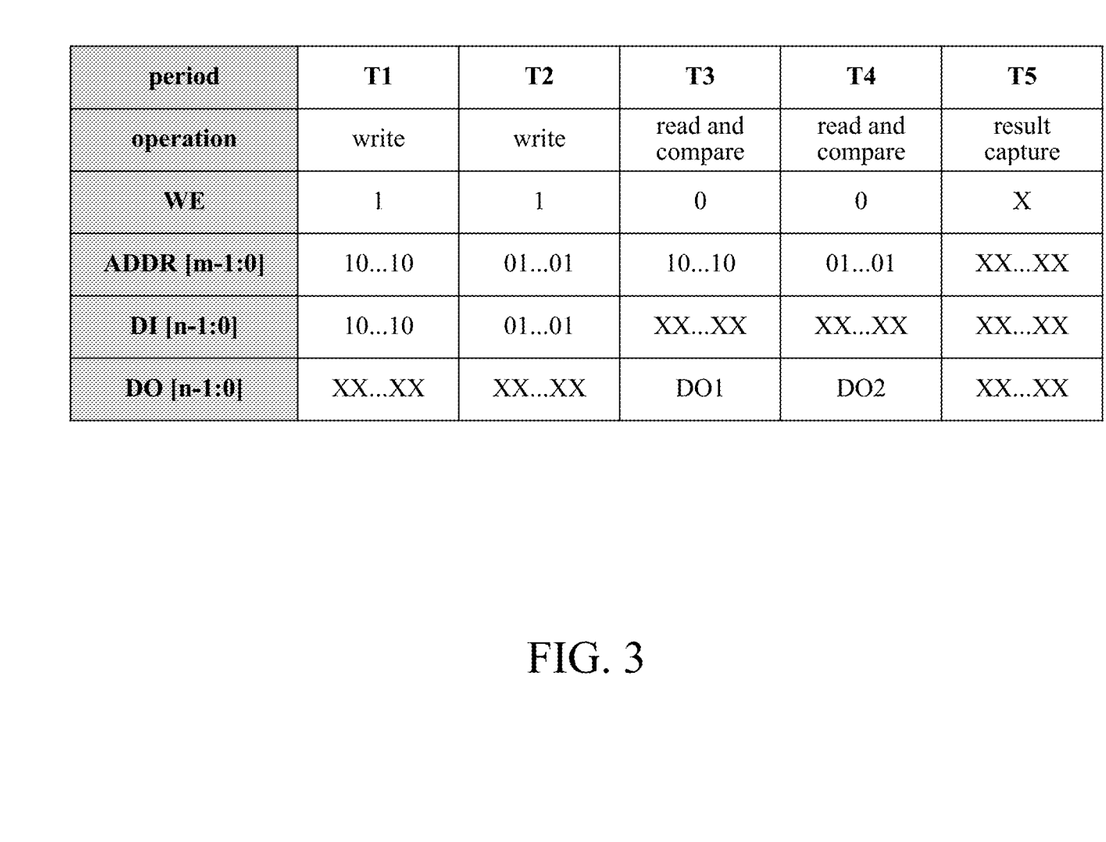
FIG. 3 shows the test flow and signal content for the bridging fault test according to the present invention.

FIG. 3 shows the test flow and signal content (test vector) for the bridging fault test according to the present invention. FIG. 3 includes the following operations. In some embodiments, periods T1 through T5 may be five consecutive periods of a clock CLK.

Period T1 (write operation, where the write enable signal WE is a logic 1): The memory test circuit 105 writes the test data DI (=10 . . . 10) into the memory address ADDR (=10 . . . 10) of the memory 160. More specifically, each of the memory address ADDR and the test data DI is an alternating logic 1 and logic 0 signal with the most significant bit being a logic 1 and the least significant bit being a logic 0.

Period T2 (write operation, where the write enable signal WE is a logic 1): The memory test circuit 105 writes the test data DI (=01 . . . 01) into the memory address ADDR (=01 . . . 01) of the memory 160. More specifically, each of the memory address ADDR and the test data DI is an alternating logic 0 and logic 1 signal with the most significant bit being a logic 0 and the least significant bit being logic 1.

Period T3 (read operation and comparison operation, where the write enable signal WE is a logic 0): The memory test circuit 105 reads the output data DO1 from the memory address ADDR (=10 . . . 10) of the memory 160, namely, reads the data stored in the memory address ADDR (=10 . . . 10) of the memory 160. Because the test data DI (=10 . . . 10) is written into the memory address ADDR (=10 . . . 10) in the period T1, an ideal value of the output data DO1 is "10 . . . 10." The memory test circuit 105 (more specifically, the comparison circuit 230) then compares the output data DO1 with the test data DI to generate a test result RLT (a first test result, temporarily stored in the storage circuit 210).

Period T4 (read operation and comparison operation, where the write enable signal WE is a logic 0): The memory test circuit 105 reads the output data DO2 from the memory address ADDR (=01 . . . 01) of the memory 160, namely, reads the data stored in the memory address ADDR (=01 . . . 01) of the memory 160. Because the test data DI (=01 . . . 01) is written into the memory address ADDR (=01 . . . 01) in the period T2, an ideal value of the output data DO2 is "01 . . . 01." The memory test circuit 105 (more specifically, the comparison circuit 230) then compares the output data DO2 with the test data to generate a test result RLT (a second test result, temporarily stored in the storage circuit 210).

Period T5 (result capture operation): The two test results are read out through a scan chain. Transmission of data through the scan chain is well known to people having ordinary skill in the art, so the details are thus omitted for brevity. When the first test result and the second test result respectively indicate that the output data DO1 and the output data DO2 are correct (i.e., the output data DO1 and the output data DO2 are respectively equal to "10 . . . 10" and "01 . . . 01"), the memory 160 passes the test. Note that because this embodiment tests the bridging fault, the ADDR (=10 . . . 10) in the periods T1 and T3 can be replaced by ADDR (=01 . . . 01), and the ADDR (=01 . . . 01) in the periods T2 and T4 can be replaced by ADDR (=10 . . . 10), which can also achieve the same test purpose.

Figure 4:
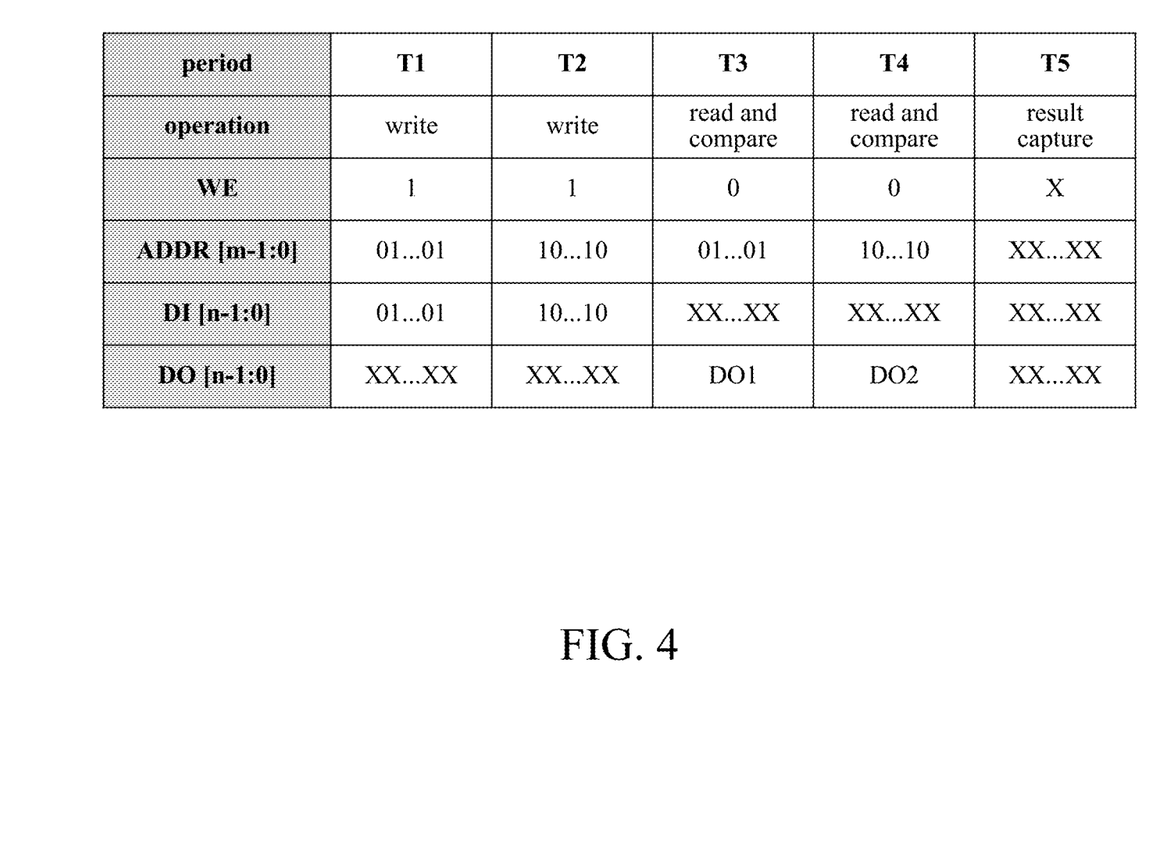
FIG. 4 shows the test flow and signal content for the bridging fault test according to the present invention.

In reference to FIG. 4, in other embodiments (also testing the bridging fault), the memory test circuit 105 writes the test data DI (=01 . . . 01) into the memory address ADDR (=01 . . . 01) in the period T1, writes the test data DI (=10 . . . 10) into the memory address ADDR (=10 . . . 10) in the period T2, reads the output data DO1 from the memory address ADDR (=01 . . . 01) and performs comparison (i.e., to determine whether the output data DO1 is equal to "01 . . . 01") in the period T3, and reads the output data DO2 from the memory address ADDR (=10 . . . 10) and performs comparison (i.e., to determine whether the output data DO2 is equal to "10 . . . 10") in the period T4. Note that because this embodiment tests the bridging fault, the address ADDR (=01 . . . 01) in the periods T1 and T3 can be replaced by ADDR (=10 . . . 10), and the address ADDR (=10 . . . 10) in the periods T2 and T4 can be replaced by ADDR (=01 . . . 01), which can also achieve the same test purpose.

Embodiment 2 (the Slow-to-Fall TDF Test and Slow-to-Rise TDF Test)

Figure 5:
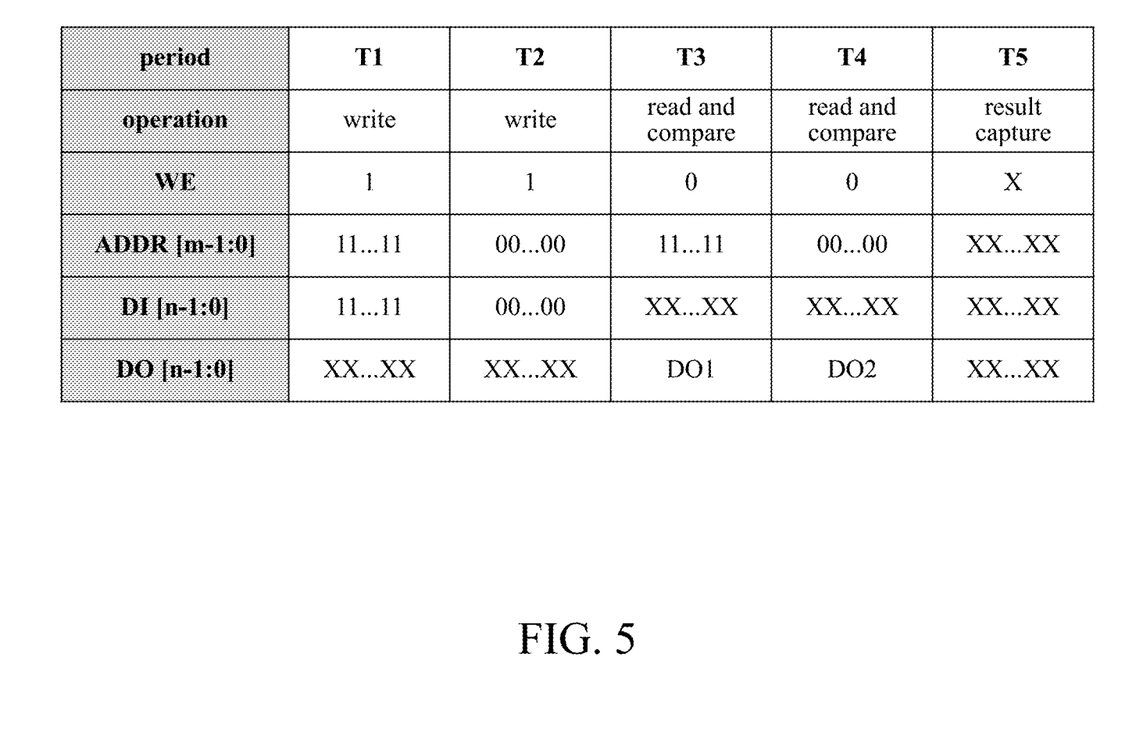
FIG. 5 shows the test flow and signal content for the slow-to-fall TDF test according to the present invention.

FIG. 5 shows the test flow and signal content for the slow-to-fall TDF test according to the present invention. FIG. 5 includes the following operations. In some embodiments, the periods T1 through T5 may be five consecutive periods of the clock CLK.

Period T1 (write operation): The memory test circuit 105 writes the test data DI (=11 . . . 11) into the memory address ADDR (=11 . . . 11) of the memory 160. More specifically, all bits of the memory address ADDR and the test data DI are logic 1.

Period T2 (write operation): The memory test circuit 105 writes the test data DI (=00 . . . 00) into the memory address ADDR (=00 . . . 00) of the memory 160. More specifically, all bits of the memory address ADDR and the test data DI are logic 0.

Period T3 (read operation and comparison operation): The memory test circuit 105 reads the output data DO1 from the memory address ADDR (=11 . . . 11) of the memory 160 and compares the output data DO1 with the test data DI (=11 . . . 11) to generate a test result RLT (a first test result, temporarily stored in the storage circuit 210).

Period T4 (read operation and comparison operation): The memory test circuit 105 reads the output data DO2 from the memory address ADDR (=00 . . . 00) of the memory 160 and compares the output data DO2 with the test data DI (=00 . . . 00) to generate a test result RLT (a second test result, temporarily stored in the storage circuit 210).

Period T5 (result capture operation): The two test results are read out through a scan chain. When the first test result and the second test result respectively indicate that the output data DO1 and the output data DO2 are correct (i.e., the output data DO1 and the output data DO2 are respectively equal to "11 . . . 11" and "00 . . . 00"), the memory 160 passes the test.

Because each bit of the write enable signal WE, the memory address ADDR, and the test data DI has transitioned from logic 1 to logic 0, the slow-to-fall TDF between the memory 160 and the functional registers 140 and 170 can be tested.

Figure 6:
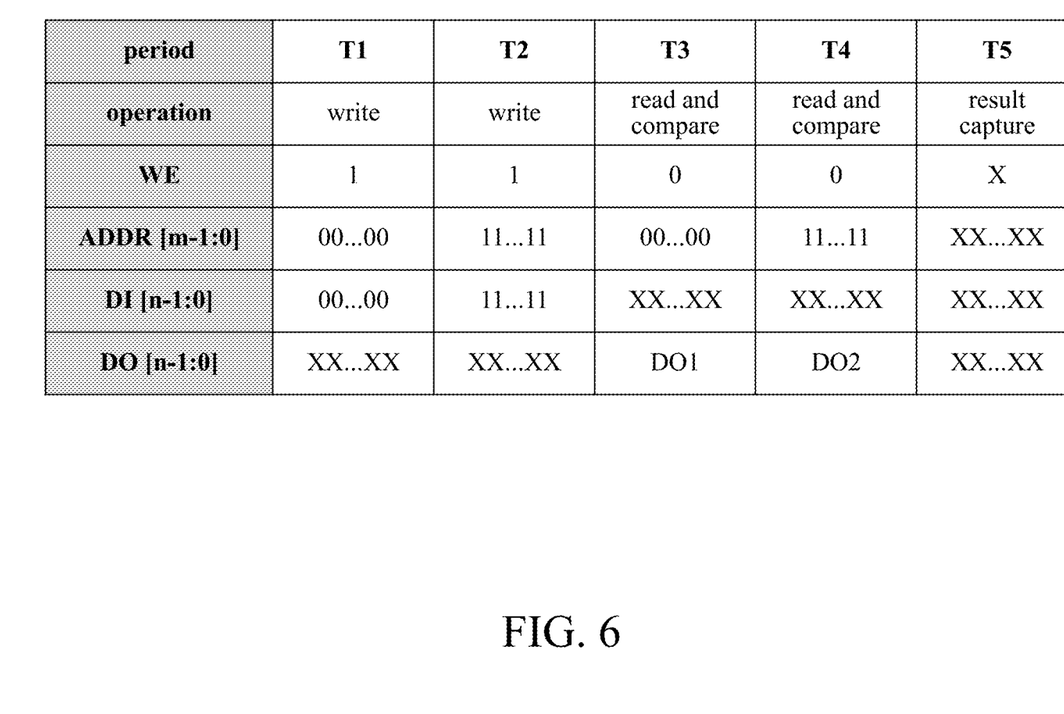
FIG. 6 shows the test flow and signal content for the slow-to-rise TDF test according to the present invention.

FIG. 6 shows the test flow and signal content for the slow-to-rise TDF test according to the present invention. FIG. 6 is similar to FIG. 5. Thus, people having ordinary skill in the art can know the details of the operations of FIG. 6 based on the discussions relating to FIG. 5, so the details are omitted for brevity. In the embodiment of FIG. 6, because each bit of the memory address ADDR and the test data DI has transitioned from logic 0 to logic 1, the slow-to-rise TDF between the memory 160 and the functional registers 140 and 170 can be tested.

Figure 7:
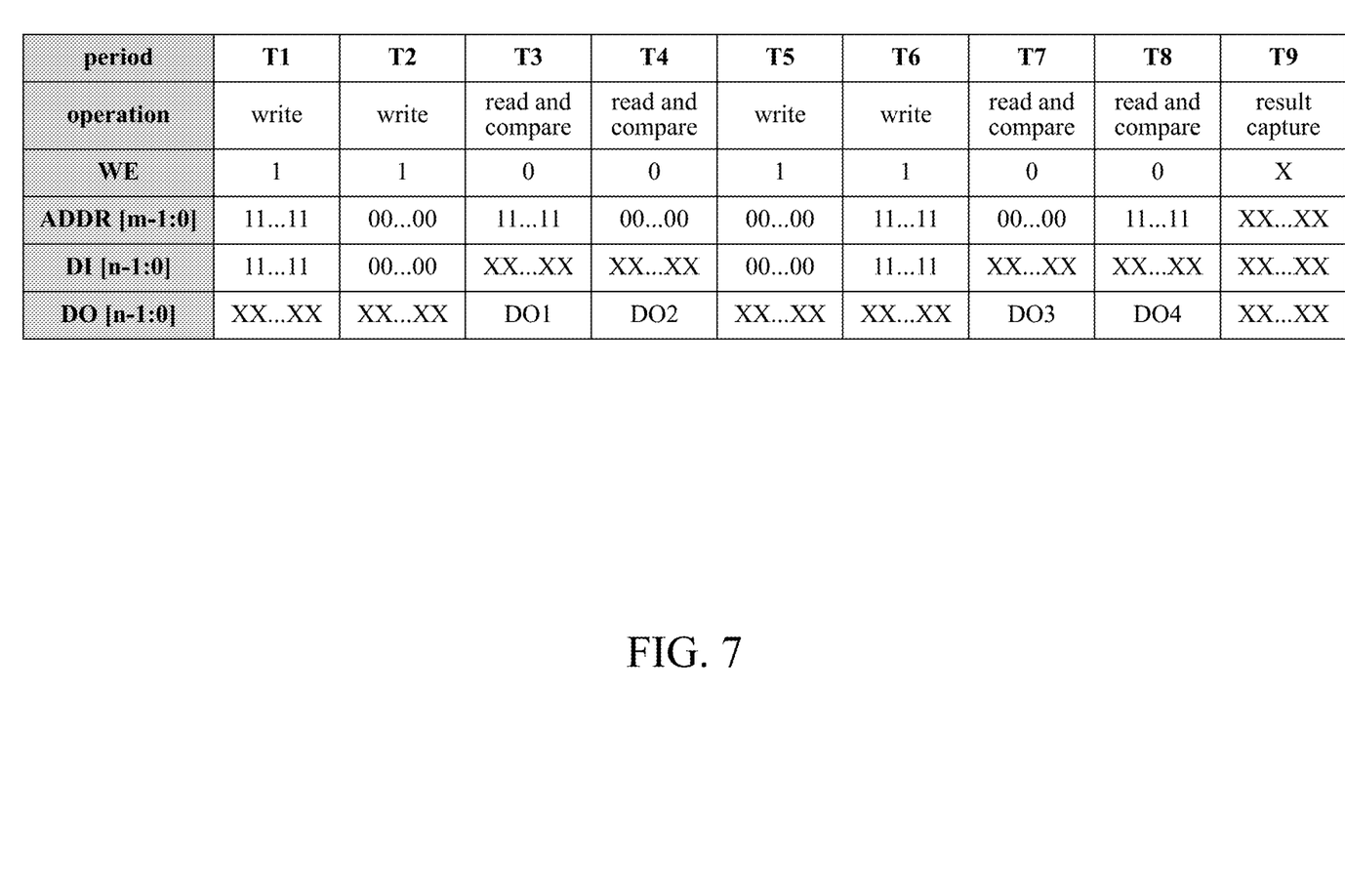
FIG. 7 shows the test flow and signal content for the slow-to-fall TDF test and the slow-to-rise TDF test according to the present invention.

FIG. 7 shows the test flow and signal content for the slow-to-fall TDF test and the slow-to-rise TDF test according to the present invention. In some embodiments, the periods T1 through T9 may be nine consecutive periods of the clock CLK. The periods T1 through T4 in FIG. 7 are the same as the periods T1 through T4 in FIG. 5, and the periods T5 through T9 in FIG. 7 are the same as the periods T1 through T5 in FIG. 6. In other words, in the embodiment shown in FIG. 7, the memory test circuit 105 first performs a slow-to-fall TDF test (the periods T1 through T4), then performs a slow-to-rise TDF test (the periods T5 through T8) on the memory 160, and finally captures the test results in the period T9. The ideal values of the output data DO3 (the period T7) and the output data DO4 (the period T8) in FIG. 7 are respectively the test data DI (=00 . . . 00) of the period T5 and the test data DI (=11 . . . 11) of the period T6.

Figure 8:
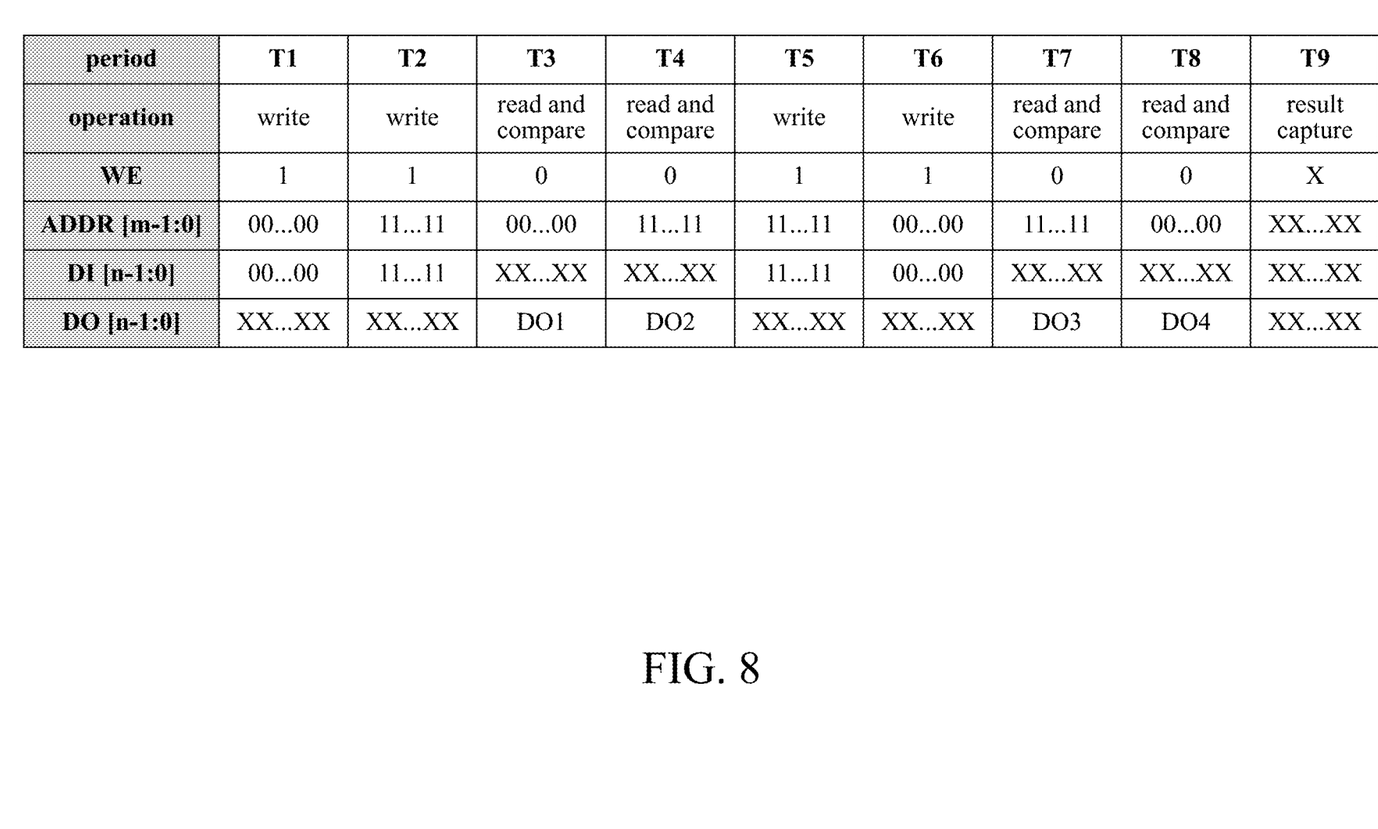
FIG. 8 shows the test flow and signal content for the slow-to-rise TDF test and the slow-to-fall TDF test according to the present invention.

FIG. 8 shows the test flow and signal content for the slow-to-rise TDF test and the slow-to-fall TDF test according to the present invention. FIG. 8 is similar to FIG. 7, except that in the embodiment of FIG. 8, the memory test circuit 105 first performs a slow-to-rise TDF test (the periods T1 through T4), then performs a slow-to-fall TDF test (the periods T5 through T8) on the memory 160, and finally captures the test results in the period T9.

Compared to the embodiments of FIG. 5 and FIG. 6, the embodiments of FIG. 7 and FIG. 8 can also perform a slow-to-rise TDF test on the write enable signal WE because the write enable signal WE transitions from the logic 0 to the logic 1 between the periods T4 and T5.

The tests in Embodiment 2 can also be used to test a stuck-at fault on a path between the register 140 and the memory 160.

Embodiment 3 (the Bridge Slow-to-Fall Fault Test and Bridge Slow-to-Rise Fault Test)

Figure 9:
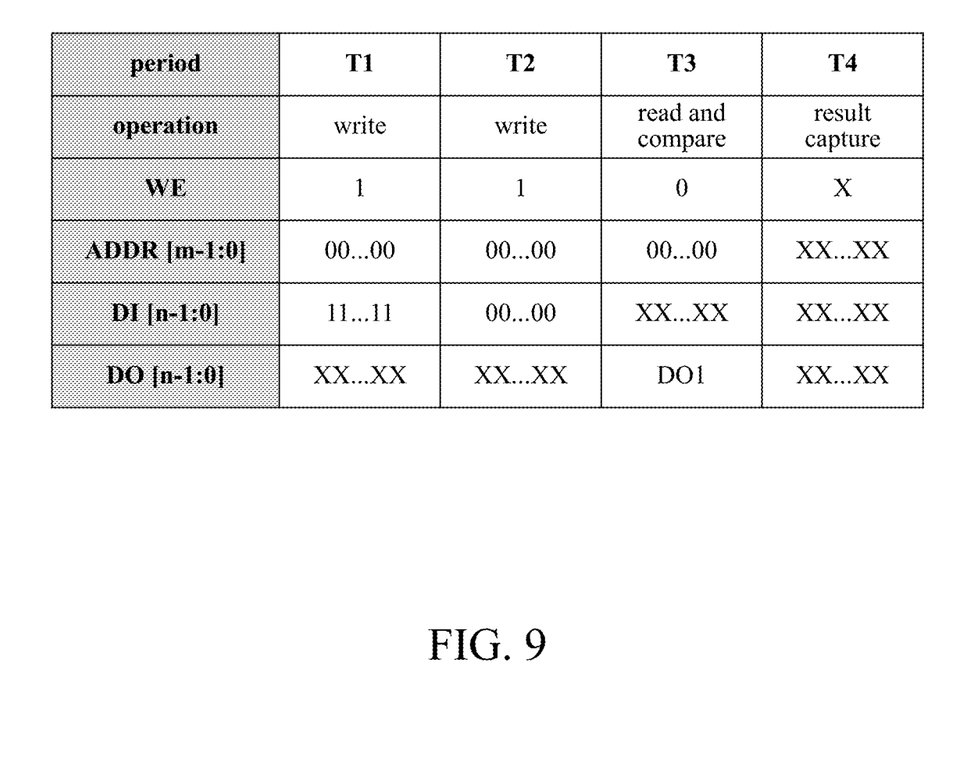
FIG. 9 shows the test flow and signal content for the bridge slow-to-fall fault test according to the present invention.

FIG. 9 shows the test flow and signal content for the bridge slow-to-fall fault test according to the present invention. FIG. 9 includes the following operations. In some embodiments, the periods T1 through T4 may be four consecutive periods of the clock CLK.

Period T1 (write operation): The memory test circuit 105 writes the test data DI (=11 . . . 11) into the memory address ADDR (=00 . . . 00) of the memory 160. More specifically, all bits of the memory address ADDR are logic 0, and all bits of the test data DI are logic 1.

Period T2 (write operation): The memory test circuit 105 writes the test data DI (=00 . . . 00) into the memory address ADDR (=00 . . . 00) of the memory 160. More specifically, all bits of the memory address ADDR and the test data DI are logic 0.

Period T3 (read operation and comparison operation): This operation is similar to the period T3 or the period T4 in FIG. 3, and the details are thus omitted for brevity. An ideal value of the output data DO1 is the test data DI (=00 . . . 00) of the period T2.

Period T4 (result capture operation): This operation is similar to the period T5 in FIG. 3, and the details are thus omitted for brevity.

Figure 10:
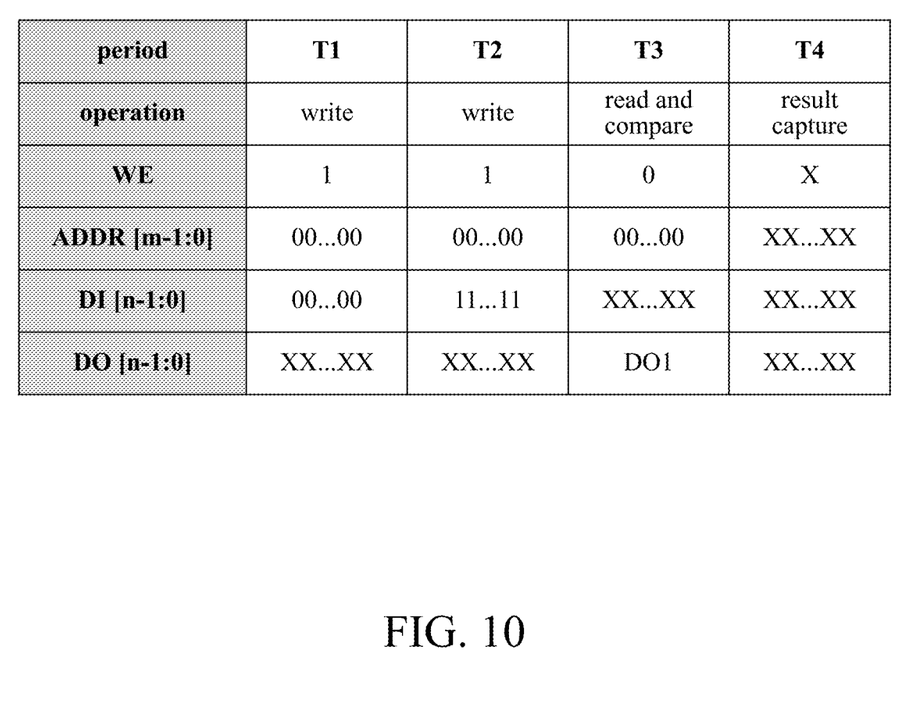
FIG. 10 shows the test flow and signal content for the bridge slow-to-rise fault test according to the present invention.

FIG. 10 shows the test flow and signal content for the bridge slow-to-rise fault test according to the present invention. FIG. 10 includes the following operations. In some embodiments, the periods T1 through T4 may be four consecutive periods of the clock CLK.

Period T1 (write operation): The memory test circuit 105 writes the test data DI (=00 . . . 00) into the memory address ADDR (=00 . . . 00) of the memory 160. More specifically, all bits of the memory address ADDR and the test data DI are logic 0.

Period T2 (write operation): The memory test circuit 105 writes the test data DI (=11 . . . 11) into the memory address ADDR (=00 . . . 00) of the memory 160. More specifically, all bits of the memory address ADDR are logic 0, and all bits of the test data DI are logic 1.

Period T3 (read operation and comparison operation): This operation is similar to the period T3 or the period T4 in FIG. 3, and the details are thus omitted for brevity. An ideal value of the output data DO1 is the test data DI (=11 . . . 11) of the period T2.

Period T4 (result capture operation): This operation is similar to the period T5 in FIG. 3, and the details are thus omitted for brevity.

Figure 11:
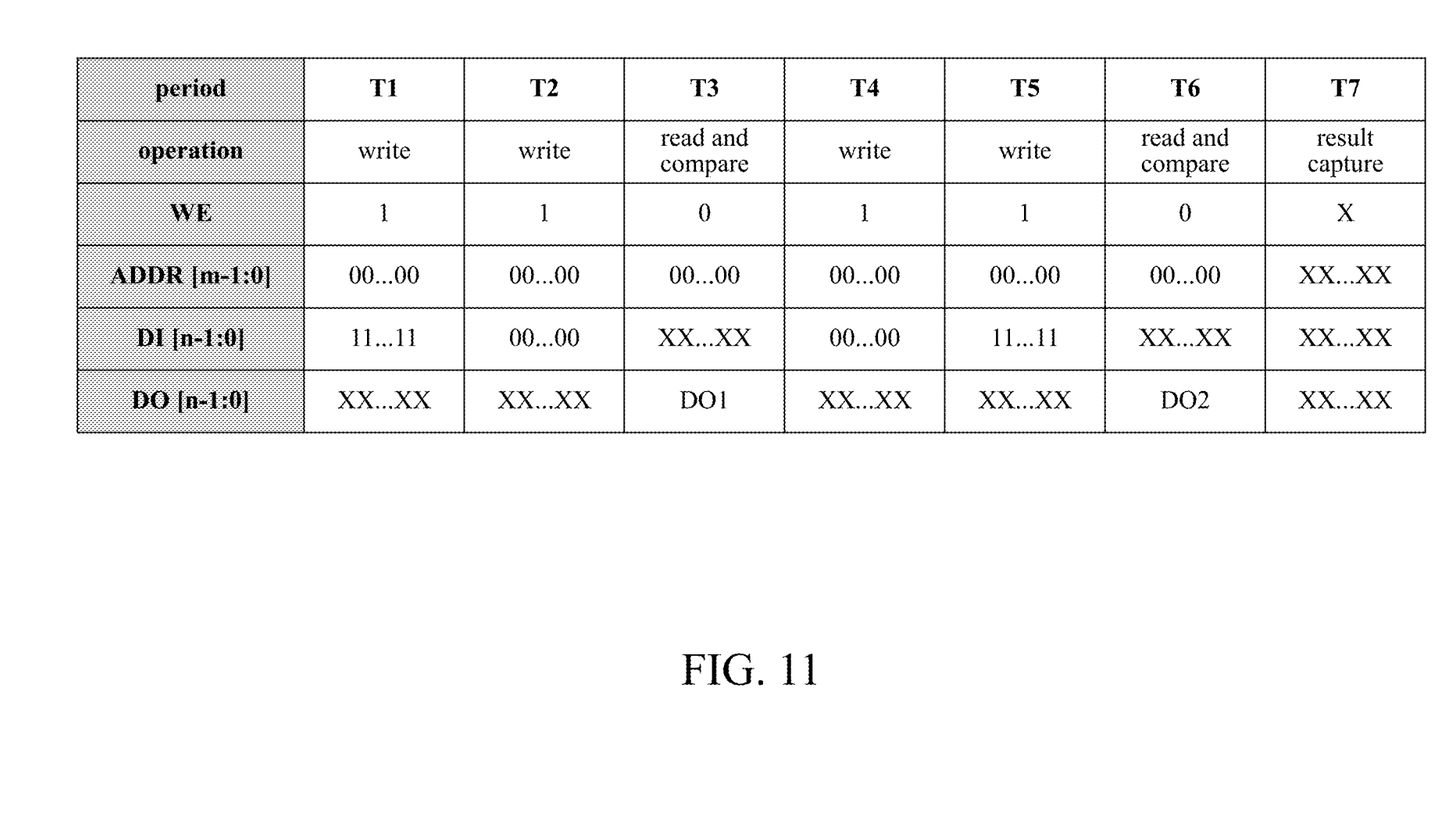
FIG. 11 shows the test flow and signal content for the bridge slow-to-fall fault test and the bridge slow-to-rise fault test according to the present invention.

FIG. 11 shows the test flow and signal content for the bridge slow-to-fall fault test and the bridge slow-to-rise fault test according to the present invention. In some embodiments, the periods T1 through T7 may be seven consecutive periods of the clock CLK. The periods T1 through T3 in FIG. 11 are the same as the periods T1 through T3 in FIG. 9, and the periods T4 through T6 in FIG. 11 are the same as the periods T1 through T3 in FIG. 10. In other words, in the embodiment shown in FIG. 11, the memory test circuit 105 first performs a bridge slow-to-fall fault test (the periods T1 through T3), the performs a bridge slow-to-rise fault test (the periods T4 through T6) on the memory 160, and finally captures the test results in the period T7. Ideal values of the output data DO1 and the output data DO2 in FIG. 11 are respectively the test data DI (=00 . . . 00) of the period T2 and the test data DI (=11 . . . 11) of the period T5.

Figure 12:
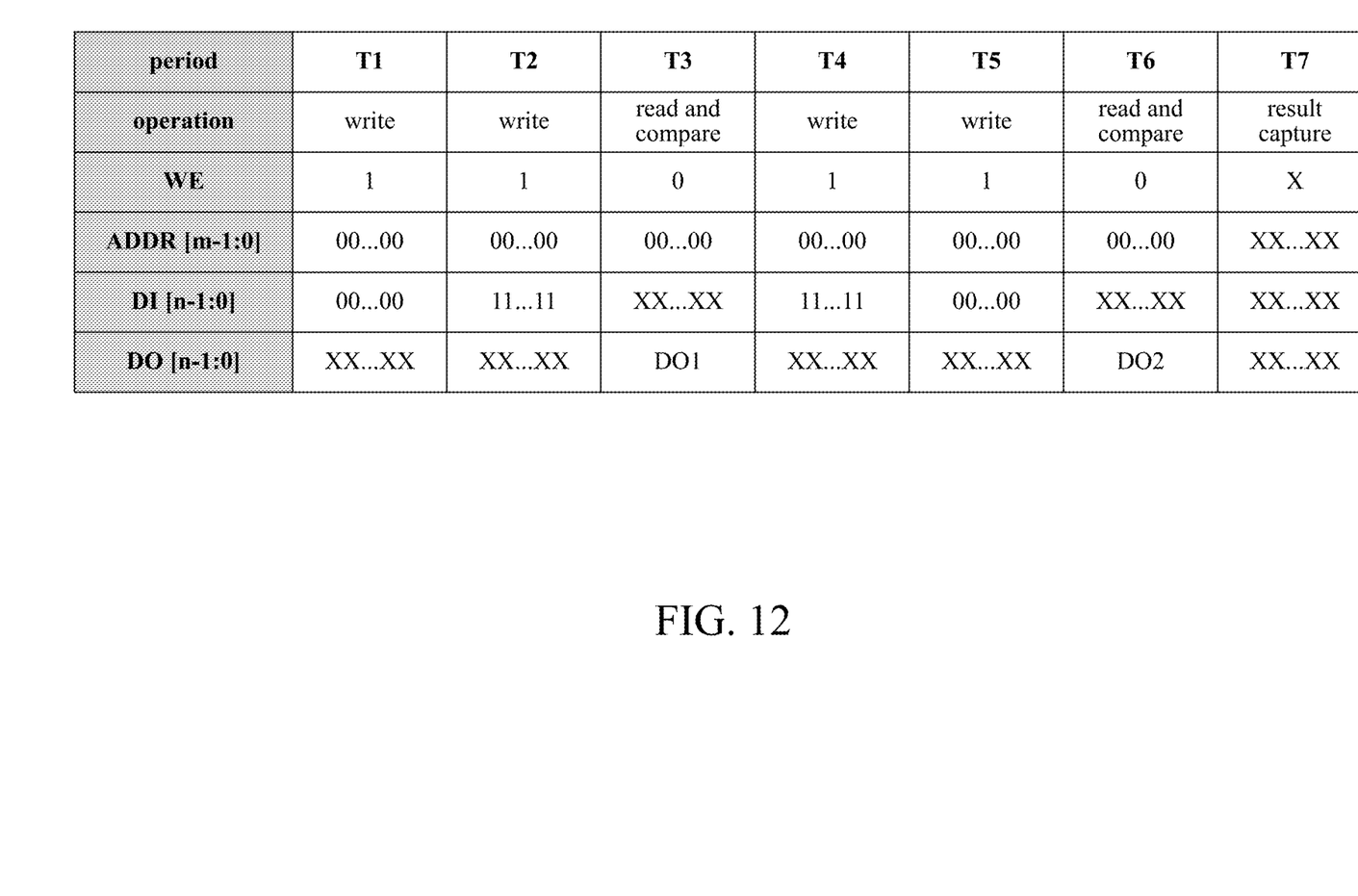
FIG. 12 shows the test flow and signal content for the bridge slow-to-rise fault test and the bridge slow-to-fall fault test according to the present invention.

FIG. 12 shows the test flow and signal content for the bridge slow-to-rise fault test and the bridge slow-to-fall fault test according to the present invention. FIG. 12 is similar to FIG. 11, except that in the embodiment of FIG. 12, the memory test circuit 105 first performs the bridge slow-to-rise fault test (the periods T1 through T3), performs the bridge slow-to-fall fault test (the periods T4 through T6) on the memory 160, and finally captures the test results in the period T7.

As can be seen from the above embodiments, since there is no complicated logic circuits between the memory test circuit 105 and the memory 160, the present invention can test the bridging fault, the slow-to-fall TDF, the slow-to-rise TDF, the bridge slow-to-fall fault, and the bridge slow-to-rise fault between the memory 160 and the functional registers 140 and 170 by using simple test data (i.e., the test data DI in FIGS. 3-12), without the need to consider complex timing in the logic circuit 120. In other words, compared to conventional ATPG technology, the present invention greatly reduces the complexity of memory testing, and can solve the problems of long test vector generation time, large number of test vectors, and low test coverage in the prior art.

The storage circuit 210 can be a memory or a register. The control circuit 220 may be a finite state machine (FSM) formed by a plurality of logic circuits, and people having ordinary skill in the art can implement the FSM based on the above discussions. The comparison circuit 230 is well known to people having ordinary skill in the art, so the details are omitted for brevity.

Figure 13:
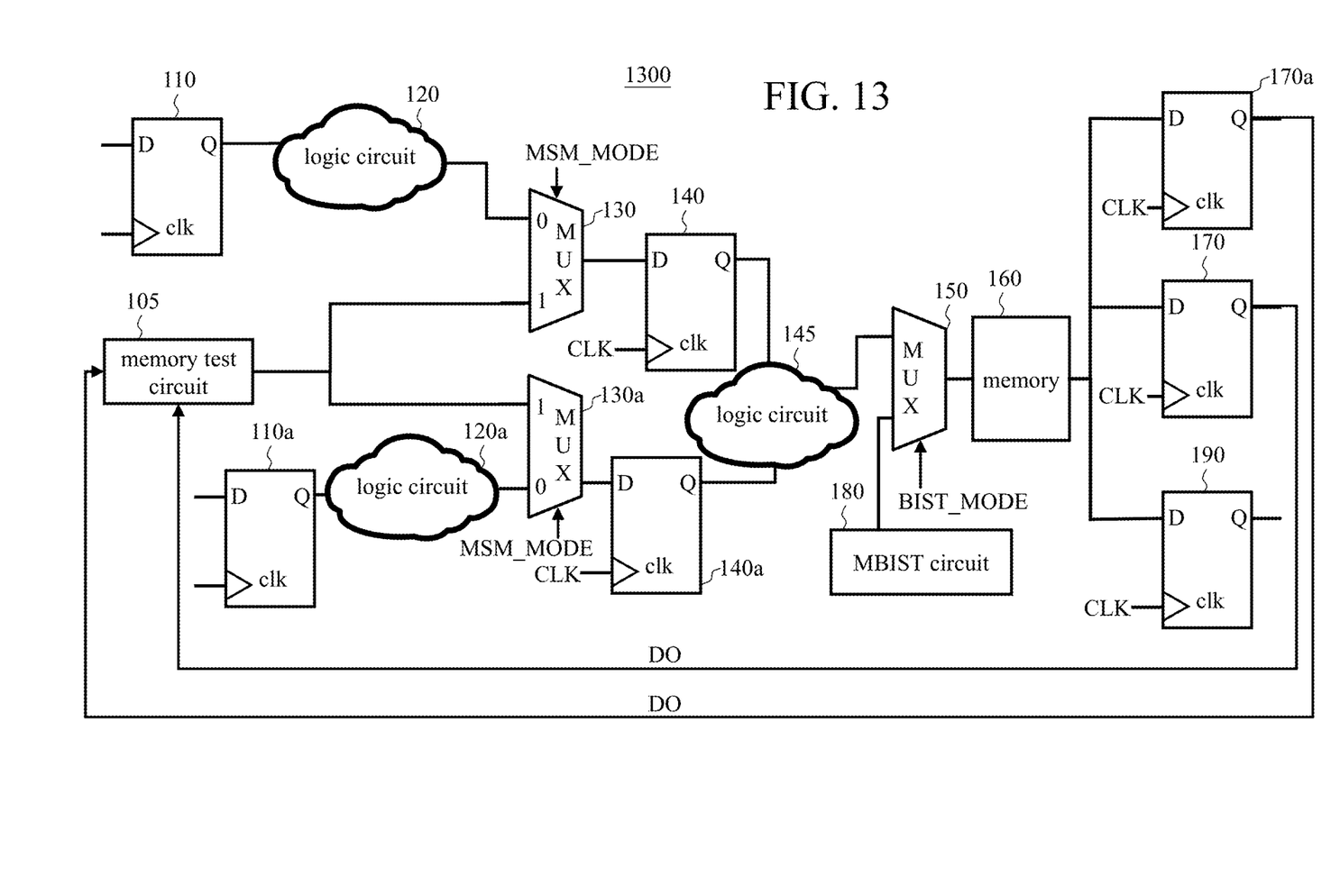
FIG. 13 shows the internal circuitry of another chip.

FIG. 13 shows internal circuitry of another chip to illustrate another application scenario of the memory test circuit 105 of the present invention. The chip 1300 includes the memory test circuit 105, the register 110, the logic circuit 120, the MUX 130, the register 140, the MUX 150, the memory 160, the register 170, the MBIST circuit 180, the register 190, a register 110a, a logic circuit 120a, a MUX 130a, a register 140a, a logic circuit 145, and a register 170a. The register 110a, the register 140a, and the register 170a are functional registers. In this embodiment, the memory test circuit 105 is further coupled to the memory 160 through the MUX 130a, the register 140a, the logic circuit 145, and the MUX 150. In addition to testing various faults between the register 140 and the memory 160 (when the mode control signal MSM_MODE=1, and the output data DO is outputted through the register 170), the memory test circuit 105 can also test various faults between the register 140a and the memory 160 (when the mode control signal MSM_MODE=1, and the output data DO is outputted through the register 170a). In other words, various data paths in the chip can share the memory test circuit 105 to save circuit area and cost.

People having ordinary skill in the art may apply the present invention to testing other types of faults in accordance with the foregoing discussions.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A test circuit for testing a memory, wherein a first input end of the memory is coupled to a first register, the test circuit transmits data to the memory through a multiplexer and the first register, a second input end of the multiplexer is coupled to the test circuit, a first output end of the multiplexer is coupled to the first register, a second output end of the memory is coupled to the test circuit through a second register, and the test circuit performs following operations sequentially:

(A) writing a first data into a first address of the memory, wherein any two adjacent bits of the first address are at different levels, and any two adjacent bits of the first data are at different levels;

(B) writing a second data into a second address of the memory, wherein any two adjacent bits of the second address are at different levels, and any two adjacent bits of the second data are at different levels;
(C) reading a first output data from the first address;
(D) reading a second output data from the second address; and
(E) determining whether the first output data and the second output data are correct by comparing the first data with the first output data and comparing the second data with the second output data.

2. The test circuit of claim 1, wherein the most significant bit of the first address is a logic 1, and the most significant bit of the first data is the logic 1.

3. The test circuit of claim 2, wherein the most significant bit of the second address is a logic 0, and the most significant bit of the second data is the logic 0.

4. The test circuit of claim 1, wherein the most significant bit of the first address is a logic 0, and the most significant bit of the first data is the logic 0.

5. The test circuit of claim 4, wherein the most significant bit of the second address is a logic 1, and the most significant bit of the second data is the logic 1.

6. The test circuit of claim 1, wherein a third input end of the multiplexer is coupled to a logic circuit to receive a function signal outputted by the logic circuit, and the multiplexer outputs signals outputted by the test circuit instead of the function signal during testing.

7. A test circuit for testing a memory, wherein a first input end of the memory is coupled to a first register, the test circuit transmits data to the memory through a multiplexer and the first register, a second input end of the multiplexer is coupled to the test circuit, a first output end of the multiplexer is coupled to the first register, a second output end of the memory is coupled to the test circuit through a second register, and the test circuit performs following operations sequentially:
(A) writing a first data into a first address of the memory, wherein all bits of the first address are at a first level, and all bits of the first data are at the first level;
(B) writing a second data into a second address of the memory, wherein all bits of the second address are at a second level, all bits of the second data are at the second level, and the second level is different from the first level;
(C) reading a first output data from the first address;
(D) reading a second output data from the second address; and
(E) determining whether the first output data and the second output data are correct by comparing the first data with the first output data and comparing the second data with the second output data.

8. The test circuit of claim 7, wherein to test a slow-to-fall transition delay fault of a write enable signal of the memory, operation (B) further comprises controlling the write enable signal to a high level, and operation (C) further comprises controlling the write enable signal to a low level.

9. The test circuit of claim 7, wherein the first level is a high level, and the second level is a low level.

10. The test circuit of claim 7, wherein the first level is a low level, and the second level is a high level.

11. The test circuit of claim 7, the test circuit further performing following operations sequentially after operation (E):

(F) writing the second data into the second address of the memory;
(G) writing the first data into the first address of the memory;
(H) reading a third output data from the second address;
(I) read a fourth output data from the first address; and
(J) determining whether the third output data and the fourth output data are correct by comparing the second data with the third output data and comparing the first data with the fourth output data.

12. The test circuit of claim 11, wherein to test a slow-to-rise transition delay fault of a write enable signal of the memory, operation (D) further comprises controlling the write enable signal to a low level, and operation (F) further comprises controlling the write enable signal to a high level.

13. The test circuit of claim 7, wherein a third input end of the multiplexer is coupled to a logic circuit to receive a function signal outputted by the logic circuit, and the multiplexer outputs signals outputted by the test circuit instead of the function signal during testing.

14. A test circuit for testing a memory, wherein a first input end of the memory is coupled to a first register, the test circuit transmits data to the memory through a multiplexer and the first register, a second input end of the multiplexer is coupled to the test circuit, a first output end of the multiplexer is coupled to the first register, a second output end of the memory is coupled to the test circuit through a second register, and the test circuit performs following operations sequentially:
(A) writing a first data into a target address of the memory, wherein all bits of the target address are at a same level, and all bits of the first data are at a same level;
(B) writing a second data into the target address of the memory, wherein all bits of the second data are at a same level, and the second data is different from the first data;
(C) reading an output data from the target address; and
(D) determining whether the output data is correct by comparing the output data with the second data.

15. The test circuit of claim 14, wherein the all bits of the target address are at a low level, the all bits of the first data are at a high level, and the all bits of the second data are at the low level.

16. The test circuit of claim 14, wherein the all bits of the target address are at a low level, the all bits of the first data are at the low level, and the all bits of the second data are at a high level.

17. The test circuit of claim 14, wherein the output data is a first output data, and the test circuit further performs following operations sequentially after operation (D):
(E) writing the second data into the target address of the memory;
(F) writing the first data into the target address of the memory;
(G) reading a second output data from the target address; and
(H) determining whether the second output data is correct by comparing the second output data with the first data.

18. The test circuit of claim 14, wherein a third input end of the multiplexer is coupled to a logic circuit to receive a function signal outputted by the logic circuit, and the multiplexer outputs signals outputted by the test circuit instead of the function signal during testing.

* * * * *